United States Patent
Ando et al.

(10) Patent No.: US 10,804,382 B2
(45) Date of Patent: Oct. 13, 2020

(54) INTEGRATED FERROELECTRIC CAPACITOR/FIELD EFFECT TRANSISTOR STRUCTURE

(71) Applicant: Samsung Electronics Co., Ltd., Suwon-si, Gyeonggi-do (KR)

(72) Inventors: Takashi Ando, Tuckahoe, NY (US); Pouya Hashemi, White Plains, NY (US); Alexander Reznicek, Troy, NY (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/787,458

(22) Filed: Feb. 11, 2020

(65) Prior Publication Data
US 2020/0176586 A1  Jun. 4, 2020

Related U.S. Application Data

(60) Continuation of application No. 16/031,616, filed on Jul. 10, 2018, now Pat. No. 10,600,892, which is a
(Continued)

(51) Int. Cl.
*H01L 29/66* (2006.01)
*H01L 29/78* (2006.01)
(Continued)

(52) U.S. Cl.
CPC .... *H01L 29/6684* (2013.01); *H01L 21/28088* (2013.01); *H01L 27/11507* (2013.01);
(Continued)

(58) Field of Classification Search
CPC ......... H01L 29/78391; H01L 29/40111; H01L 21/28088; H01L 27/11507; H01L 29/1083;
(Continued)

(56) References Cited

U.S. PATENT DOCUMENTS 5,907,762 A    5/1999 Evans et al.
7,592,656 B2   9/2009 Kikuchi et al.
(Continued)

OTHER PUBLICATIONS

Lee et al. "Prospects for ferroelectric HfZrOx FETs with experimentally CET=0.98nm, SSfor=42mV/dec, SSrev=28mV/dec, switch-off <0.2V, and hysteresis-free strategies" 2015 IEEE International Electron Devices Meeting (IEDM) (pp. 22.5.1-22.5.4) (Dec. 2015).
(Continued)

*Primary Examiner* — Feifei Yeung Lopez
(74) *Attorney, Agent, or Firm* — Myers Bigel, P.A.

(57) ABSTRACT

A replacement gate structure (i.e., functional gate structure) is formed and recessed to provide a capacitor cavity located above the recessed functional gate structure. A ferroelectric capacitor is formed in the capacitor cavity and includes a bottom electrode structure, a U-shaped ferroelectric material liner and a top electrode structure. The bottom electrode structure has a topmost surface that does not extend above the U-shaped ferroelectric material liner. A contact structure is formed above and in contact with the U-shaped ferroelectric material liner and the top electrode structure of the ferroelectric capacitor.

20 Claims, 10 Drawing Sheets

Related U.S. Application Data division of application No. 15/264,142, filed on Sep. 13, 2016, now Pat. No. 10,050,143.

(51) Int. Cl.

| | | |
|---|---|---|
| *H01L 29/49* | (2006.01) | |
| *H01L 29/06* | (2006.01) | |
| *H01L 29/10* | (2006.01) | |
| *H01L 21/28* | (2006.01) | |
| *H01L 27/11507* | (2017.01) | |

(52) U.S. Cl.
CPC ...... *H01L 29/0649* (2013.01); *H01L 29/1083* (2013.01); *H01L 29/40111* (2019.08); *H01L 29/4966* (2013.01); *H01L 29/78391* (2014.09); *H01L 29/785* (2013.01)

(58) Field of Classification Search
CPC ............. H01L 29/4966; H01L 29/6684; H01L 29/785
See application file for complete search history.

(56) References Cited

U.S. PATENT DOCUMENTS

| 9,627,509 B2 | 4/2017 | Koo et al. |
|---|---|---|
| 2003/0067022 A1* | 4/2003 | Sakai ............... H01L 29/78391 257/295 |
| 2010/0163971 A1 | 7/2010 | Hung et al. |
| 2014/0349452 A1 | 11/2014 | Wang et al. |

OTHER PUBLICATIONS

Li et al. "Sub-60mV-swing negative-capacitance FinFET without hysteresis" 2015 IEEE International Electron Devices Meeting (IEDM) (pp. 22.6.1-22.6.4) (Dec. 2015).

List of IBM Patents or Patent Applications Treated as Related (2 pages) (Jul. 10, 2018).

* cited by examiner

US 10,804,382 B2

INTEGRATED FERROELECTRIC CAPACITOR/FIELD EFFECT TRANSISTOR STRUCTURE

CROSS-REFERENCE TO RELATED APPLICATIONS

The present application is a continuation of and claims priority from U.S. patent application Ser. No. 16/031,616, filed Jul. 10, 2018, which is a divisional of and claims priority from U.S. patent application Ser. No. 15/264,142, now U.S. Pat. No. 10,050,143, filed Sep. 13, 2016, both of which are incorporated herein by reference in their entirety as if fully set forth herein.

BACKGROUND

The present application relates to a semiconductor structure and a method of forming the same. More particularly, the present application relates to a semiconductor structure that includes a ferroelectric capacitor that is in series with an underlying functional gate structure and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

Recently, negative capacitance ferroelectric finFETs have drawn attention for extending beyond current CMOS technology. Use of ferroelectric materials with negative capacitance such as, for example, HfZrO, in series with the gate stack of a MOSFET can dramatically increase the total capacitance of the MOSFET and can achieve steep threshold voltage swings.

Using existing technology, integration of a ferroelectric capacitor in a replacement gate process flow is challenging due to limited space for device formation and/or shorting of the ferroelectric capacitor. As such, there is a need for providing a method in which a ferroelectric capacitor can be readily integrated in a replacement gate process flow, while circumventing the space issue and/or shorting issue that hampers existing technology.

SUMMARY

A replacement gate structure (i.e., functional gate structure) is formed and recessed to provide a capacitor cavity located above the recessed functional gate structure. A ferroelectric capacitor is formed in the capacitor cavity and includes a bottom electrode structure, a U-shaped ferroelectric material liner and a top electrode structure. The bottom electrode structure has a topmost surface that does not extend above the U-shaped ferroelectric material liner. A contact structure is formed above and in contact with the U-shaped ferroelectric material liner and the top electrode structure of the ferroelectric capacitor.

One aspect of the present application relates to a semiconductor structure. In one embodiment of the present application, the semiconductor structure may include a functional gate structure located on a surface of a semiconductor material portion. A ferroelectric capacitor is located directly above, and in contact with, a topmost surface of the functional gate structure. The ferroelectric capacitor includes a bottom electrode structure, a U-shaped ferroelectric material liner and a top electrode structure, wherein the bottom electrode structure is located entirely beneath the U-shaped ferroelectric material liner.

Another aspect of the present application relates to a method of forming a semiconductor structure. In one embodiment of the present application, the method may include providing a functional gate structure located on a surface of a semiconductor material portion and surrounded by a middle-of-the-line (MOL) dielectric material, wherein a topmost surface of the MOL dielectric material is coplanar with a topmost surface of the functional gate structure. Next, the functional gate structure is recessed to provide a capacitor cavity located above a remaining portion of the functional gate structure. A ferroelectric capacitor is then formed in the capacitor cavity. The ferroelectric capacitor that is formed includes a bottom electrode structure, a U-shaped ferroelectric material liner and a top electrode structure, wherein the bottom electrode structure is located entirely beneath the U-shaped ferroelectric material liner.

DETAILED DESCRIPTION

Figure 1:
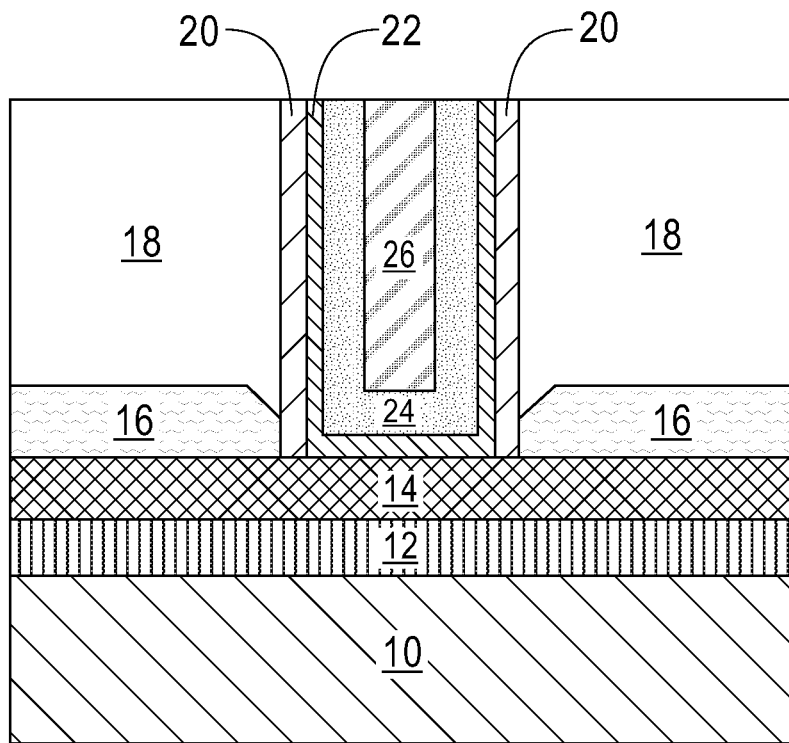
FIG. 1 is a cross sectional view of an exemplary semiconductor structure including a functional gate structure located on a portion of a semiconductor material portion and surrounded on both sides by a middle-of-the-line (MOL) dielectric material in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with the present application. The exemplary semiconductor structure includes a functional gate structure (22, 24, 26) located on a portion of a semiconductor material portion 14 and surrounded on both sides by a middle-of-the-line (MOL) dielectric material 18. It is noted that the functional gate structure (22, 24, 26) employed may be referred to merely as a replacement gate structure. As is shown, the topmost surface of the functional gate structure (22, 24, 26) is coplanar with a topmost surface of the MOL dielectric material 18. Although a single functional gate structure (22, 24, 26) is described and illustrated, the present application works when a plurality of functional gate structures are present in the MOL dielectric material 18.

The exemplary semiconductor structure further includes gate spacers 20 located on each sidewall surface of the functional gate structure (22, 24, 26), raised source/drain regions 16 located on other portions of the semiconductor material portion 14 and on each side of the functional gate structure (22, 24, 26), and a material stack of a substrate 10 and an insulator layer or punch-through stop layer (hereinafter insulator layer/punch-through stop layer 12). As is shown, the semiconductor material portion 14 is located on a topmost surface of the insulator layer/punch-through stop layer 12, and the insulator layer/punch-through stop layer 12 is located on a topmost surface of the substrate 10.

The substrate 10 may include a semiconductor material or stack of semiconductor materials having semiconducting properties. Illustrative examples of semiconductor materials that may provide substrate 10 include, but are not limited to, silicon (Si), germanium (Ge), silicon germanium alloys (SiGe), III-V compound semiconductors and/or II-VI compound semiconductors. III-V compound semiconductors include at least one element from Group III of the Periodic Table of Elements and at least one element from Group V of the Periodic Table of Elements, while II-VI compound semiconductors include at least one element from Group II of the Periodic Table of Elements and at least one element from Group VI of the Periodic Table of Elements. In one example, the substrate 10 may be entirely composed of single crystal silicon.

In one embodiment, layer 12 is composed of an insulator. In such an embodiment, the insulator may include a crystalline or non-crystalline oxide or nitride. In one example, the insulator that can be used as layer 12 is composed of silicon dioxide.

In another embodiment, layer 12 is a punch-through stop material that includes one of the semiconductor materials mentioned above for substrate 10 that is doped with a p-type or an n-type dopant. In one embodiment, the semiconductor material that provides layer 12 may be a same semiconductor material as the semiconductor material that provides substrate 10. In another embodiment, the semiconductor material that provides layer 12 may be a different semiconductor material than the semiconductor material that provides substrate 10.

The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The concentration of dopant that provides the punch-through stop material for layer 12 can range from $5 \times 10^{18}$ atoms/cm$^3$ to $5 \times 10^{19}$ atoms/cm$^3$.

In one embodiment, the punch-through stop layer can be formed by introducing a p-type dopant or an n-type dopant into an upper portion of substrate 10. In such an embodiment, the dopant can be introduced into an upper portion of substrate 10 utilizing gas phase doping or ion implantation.

In another embodiment, the punch-through stop layer can be formed by an epitaxial growth (or deposition) process. The terms "epitaxial growth and/or deposition" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation.

Examples of various epitaxial growth process apparatuses that are suitable for use in the present application may include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE) or metal-organic CVD (MOCVD). The temperature for epitaxial deposition process typically ranges from 250° C. to 900° C. Although higher temperature typically results in faster deposition, the faster deposition may result in crystal defects and film cracking. A number of different source gases may be used for the deposition of the semiconductor material that can be used to provide the punch-through stop layer. In some embodiments, the source gas for the deposition of the semiconductor material that provides the punch-through stop layer may include a silicon containing gas source or a mixture of a silicon containing gas source and a germanium containing gas source. Carrier gases like hydrogen, nitrogen, helium and argon can be used. The dopant that is present in the punch-through stop layer can be added during the epitaxial growth process or subsequent to the epitaxial growth process. When the dopant is added subsequent to the epitaxial growth process, the dopant may be introduced into the epitaxial deposited semiconductor material utilizing gas phase doping or ion implantation.

The semiconductor material portion 14 may include one of the semiconductor materials mentioned above for substrate 10. In one embodiment, the semiconductor material that provides semiconductor material portion 14 may be a same semiconductor material as the semiconductor material that provides substrate 10. In another embodiment, the semiconductor material that provides the semiconductor material portion 14 may be a different semiconductor material than the semiconductor material that provides substrate 10. In embodiments in which layer 12 is a punch-through stop layer, the semiconductor material that provides the semiconductor material portion 14 may be the same as, or different from, the semiconductor material that provides the punch-through stop layer.

In some embodiments, the semiconductor material portion 14 may a semiconductor fin. The semiconductor fin can be formed utilizing a patterning process such as, for example, lithography and etching, or a sidewall image transfer (SIT) process. The term "semiconductor fin" denotes a contiguous semiconductor structure that extends upward from a surface of a substrate (e.g., layer 12) and has a pair of vertical sidewalls that are parallel to each other. As used herein, a surface is "vertical" if there exists a vertical plane from which the surface does not deviate by more than three times the root mean square roughness of the surface. The height and width of the semiconductor fins can vary. In some other embodiments, the semiconductor material portion 14 may be a semiconductor nanowire or a semiconductor nanosheet. A semiconductor nanowire or semiconductor nanosheet can be formed utilizing lithography and etching. In some other embodiments, the semiconductor material portion is a semiconductor material layer that is used in forming a planar semiconductor device.

The exemplary semiconductor structure shown in FIG. 1 can be formed utilizing any gate-last (i.e., replacement gate) process that is well known to those skilled in the art. Generally, in a gate-last process a sacrificial gate structure (not shown) is formed on a surface of the semiconductor material portion 14. The term "sacrificial gate structure" denotes a material or material stack that serves as a placeholder material for the functional gate structure (22, 24, 26). The term "functional gate structure" denotes a permanent gate structure used to control output current (i.e., flow of carrier in a channel region) of a semiconducting device through electrical or magnetic fields. After forming the sacrificial gate structure, gate spacers 20 are formed on each side of the sacrificial gate structure. The gate spacers 20 can be formed by depositing a spacer dielectric material such as, for example, silicon dioxide and/or silicon nitride, and thereafter the deposited spacer dielectric material is etched to provide the gate spacers 20. In some embodiments, gate spacer 20 formation may be omitted.

Source/drain regions including raised source/drain structures 16 are formed on both sides of the sacrificial gate structure. As is known to those skilled in the art, a source region is formed on one side of a gate structure, while a drain region is formed on another side of the gate structure. The source/drain regions can be formed into portions of the semiconductor material portion 14 that are not covered by the sacrificial gate structure utilizing gas phase doping, ion implantation or dopant diffusion. The raised source/drain regions 16 can be formed utilizing an epitaxial growth process as mentioned above in forming the punch-through stop layer. The raised source/drain regions 16 include a semiconductor material (that may be the same or different from the semiconductor material portion 14) that is doped with an n-type dopant or a p-type dopant as mentioned above. The raised source/drain regions 16 may have a dopant concentration from $1 \times 10^{20}$ atoms/cm$^3$ to $3 \times 10^{21}$ atoms/cm$^3$. In some embodiments, the formation of raised source/drain regions 16 may be omitted.

Following formation of the source/drain regions including the raised source/drain region 16, the MOL dielectric material 18 is formed. As is shown in the illustrated embodiment, the MOL dielectric material 18 is formed directly on a topmost surface of the raised source/drain region 16. The MOL dielectric material 18 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Typically, the MOL dielectric material 18 is composed of a different dielectric material than the gate spacers 20. In another embodiment, a self-planarizing material such as a spin-on glass (SOG) or a spin-on low-k dielectric material such as SiLK™ can be used as the MOL dielectric material 18. The use of a self-planarizing dielectric material as MOL dielectric material 18 may avoid the need to perform a subsequent planarizing step.

In one embodiment, the MOL dielectric material 18 can be formed utilizing a deposition process including, for example, chemical vapor deposition (CVD), plasma enhanced chemical vapor deposition (PECVD), evaporation or spin-on coating. In some embodiments, a planarization process or an etch back process follows the deposition of the MOL dielectric material 18. The thickness of the MOL dielectric material 18 that can be employed in the present application may vary depending on the type of dielectric material employed as well as the method that was employed in forming the same. In one embodiment, the MOL dielectric material 18 has a thickness from 80 nm to 500 nm. Other thicknesses that are greater or lesser than the range provided above can also be used for the MOL dielectric material 18.

After forming the MOL dielectric material 18, the gate-last process continues by replacing the sacrificial gate structure with functional gate structure (22, 24, 26). The replacing the sacrificial gate structure includes removing the sacrificial gate structure utilizing an etching process, and thereafter the functional gate structure (22, 24, 26) is formed in a gate cavity that comprises a volume of the removed sacrificial gate structure. The forming of the functional gate structure (22, 24, 26) includes depositing the various material layers that provide the functional gate structure (22, 24, 26) and performing a planarization process such as, for example, chemical mechanical polishing, to remove the various material layers from above the topmost surface of the MOL dielectric material 18. Portions of the various material layers that provide the functional gate structure remain in the gate cavity forming the functional gate structure (22, 24, 26) shown in FIG. 1.

In the illustrated embodiment, functional gate structure includes a gate dielectric 22, a work function metal 24 and a gate electrode 26. In some embodiments, the work function metal may be omitted. As is shown, the gate dielectric 22 and the workfunction metal 24 are both U-shaped. By "U-shaped" it is meant a structure that includes a horizontal portion and two vertical extending portions that extend upwards from each end of the horizontal portion. In some embodiments and as is shown, the topmost surfaces of each of the gate dielectric 22, the work function metal 24 and the gate electrode 26 are coplanar with each other as well as being coplanar with the topmost surface of the MOL dielectric material 18.

The gate dielectric 22 may comprise any gate dielectric material. The gate dielectric material that provides the gate dielectric 22 can be an oxide, nitride, and/or oxynitride. In one example, the gate dielectric material that provides the gate dielectric 22 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric 22.

The gate dielectric material used in providing the gate dielectric 22 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric 22 can have a thickness in a range from 1 nm to 10 nm. Other thicknesses that are lesser than, or greater than, the aforementioned thickness range can also be employed for the gate dielectric material.

In one embodiment, the work function metal 24 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal is composed of at least one of TiAl, TaN, TiN, HfN, HfSi, or combinations thereof. The n-type work function metal that can provide the work function metal 24 can be formed using chemical vapor deposition atomic layer deposition, sputtering or plating.

In another embodiment, the work function metal 24 may be a p-type work function metal. As used herein, a "p-type work function metal" is a metal that effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal may be composed of titanium, titanium nitride or titanium carbide. The p-type work function metal may also be composed of TiAlN, Ru, Pt, Mo, Co and alloys and combinations thereof. In one embodiment, the p-type work function metal that provide the work function metal 24 can be formed by, a physical vapor deposition method, such as sputtering, chemical vapor deposition or atomic layer deposition.

The work function metal 24 can have a thickness in a range from 1 nm to 10 nm. Other thicknesses that are lesser than, or greater than, the aforementioned thickness range can also be employed for the used as the thickness of the work function metal 24.

As is shown in FIG. 1, the sidewalls and a bottommost surface of the gate electrode 26 are surrounded by the work function metal 24. If the work function metal 24 is not present, the sidewalls and a bottommost surface of the gate electrode 26 are surrounded by the gate dielectric 22. The gate electrode 26 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The gate electrode 26 can be formed utilizing a deposition process including, for example, chemical vapor deposition plasma enhanced chemical vapor deposition, physical vapor deposition, sputtering, atomic layer deposition or other like deposition processes. When a metal silicide is formed, a conventional silicidation process is employed. In one embodiment, the gate electrode portion 26 has a thickness from 1 nm to 100 nm. Other thicknesses that are lesser than, or greater than, the aforementioned thickness range can also be employed for the gate electrode 26.

Figure 2:
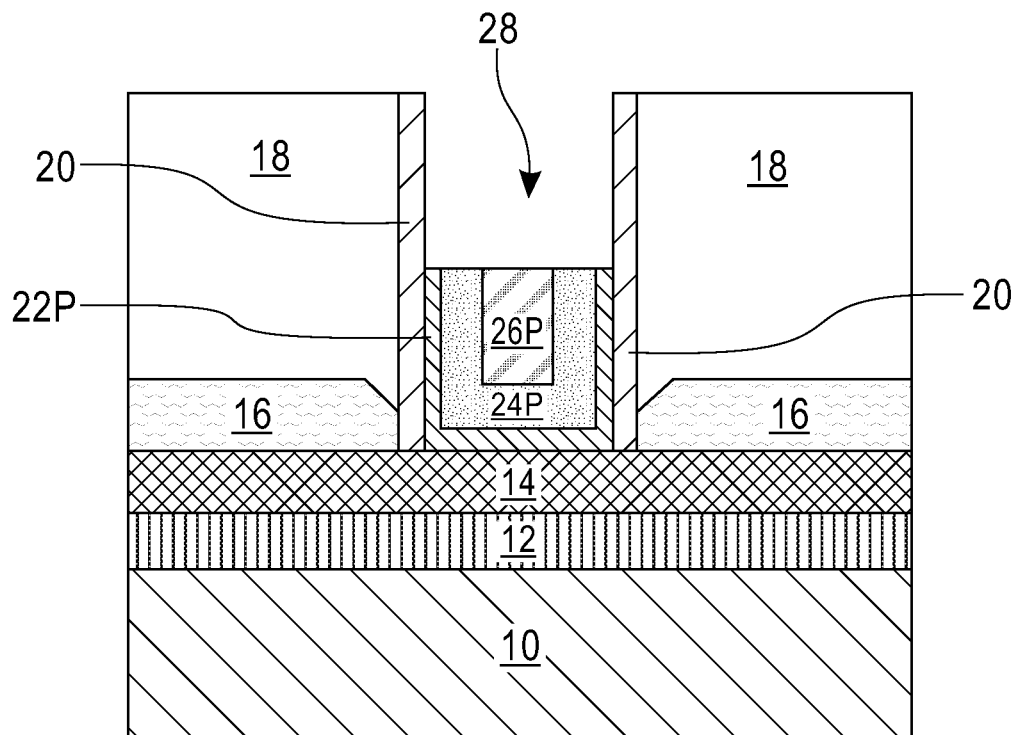
FIG. 2 is a cross sectional view of the exemplary semiconductor structure of FIG. 1 after recessing an upper portion of the functional gate structure to provide a capacitor cavity.

Referring now to FIG. 2, there is illustrated the exemplary semiconductor structure of FIG. 1 after recessing an upper portion of the functional gate structure (22, 24, 26) to provide a capacitor cavity 28. Capacitor cavity 28 is located above a remaining portion of the functional gate structure and is confined between inner sidewalls of the gate spacers 20, if present, or inner sidewalls of the MOL dielectric material 18 if the gate spacers 20 are not present. Recessing the upper portion of the functional gate structure (22, 24, 26) may be performed by utilizing one or more etching steps such as, for example, reactive ion etching. In FIG. 2, the remaining portion of the gate dielectric 22 can be referred to a gate dielectric portion 22P, the remaining portion of the workfunction metal 24 can be referred to a workfunction metal portion 26P, and the remaining portion of the gate electrode 26 may be referred to a gate electrode portion 26P. The recessed functional gate structure (22P, 24P, 26P) has a topmost surface that is located below a topmost surface of the MOL dielectric material 18.

Figure 3:
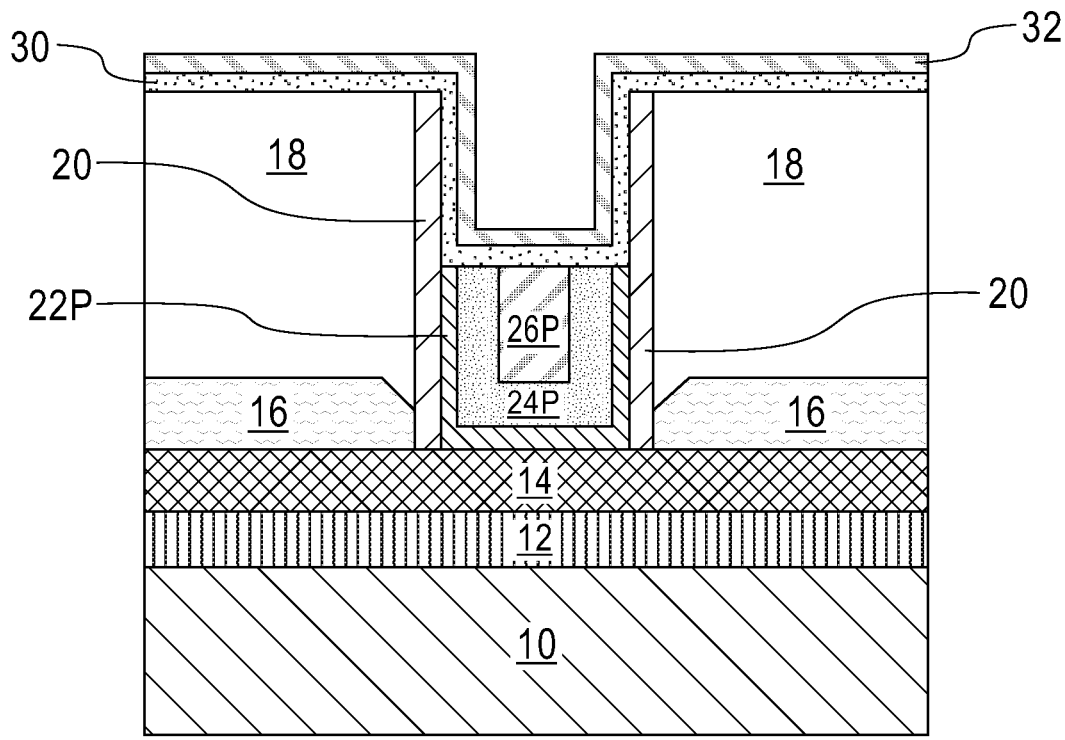
FIG. 3 is a cross sectional view of the exemplary semiconductor structure of FIG. 2 after forming a material stack of, from bottom to top, a bottom electrode material layer, and a ferroelectric material layer.

Referring now to FIG. 3, there is illustrated the exemplary semiconductor structure of FIG. 2 after forming a material stack of, from bottom to top, a bottom electrode material layer 30, and a ferroelectric material layer 32. As is shown, portions of each of the bottom electrode material layer 30, and the ferroelectric material layer 32 are formed above the topmost surface of the ILD dielectric material 18, while other portions of the bottom electrode material layer 30, and the ferroelectric material layer 32 are formed within the capacitor cavity 28.

The bottom electrode material layer 30 is a continuous (without voids or breaks) layer that may include one of the conductive materials mentioned above for the gate electrode portion 26P of the functional gate structure. Typically, but not necessarily always, the conductive material that provides bottom electrode material layer 30 is different from the conductive material that provides the gate electrode portion 26P. In one example, the bottom electrode material layer 30 may include TiN, while the gate electrode portion 26 may include tungsten or titanium. The bottom electrode material layer 30 may be formed by a deposition process such as, for example, chemical vapor deposition, plasma enhanced chemical deposition or physical vapor deposition. The bottom electrode material layer 30 has a thickness which does not fill in the entire volume of the capacitor cavity 28. In one example, the thickness of the bottom electrode material layer 30 can be from 5 nm to 25 nm. As is shown, the bottom electrode material layer 30 includes a bottommost surface that contacts a topmost surface of the recessed functional gate structure (22P, 24P, 26P).

The ferroelectric material layer 32 is a continuous (without voids or breaks) layer that includes any material that generates negative capacitance. Examples of materials that can be used as the ferroelectric material layer 32 include mixed metal oxides such as $BaTiO_3$, $Pb[Zr_xTi_{1-x}]O_3$ ($0 \leq x \leq 1$), and crystalline $HfO_2$ with a doping element selected from Zr, Al, Ca, Ce, Dy, Er, Gd, Ge, La, Sc, Si, Sr, Sn, and Y. The ferroelectric material layer 32 may be formed by a deposition process such as, for example, chemical vapor deposition, plasma enhanced chemical deposition or atomic layer deposition. The ferroelectric material layer 32 also has a thickness which does not fill in the entire volume of the capacitor cavity 28. In one example, the thickness of the ferroelectric material layer 32 can be from 5 nm to 25 nm.

Figure 4:
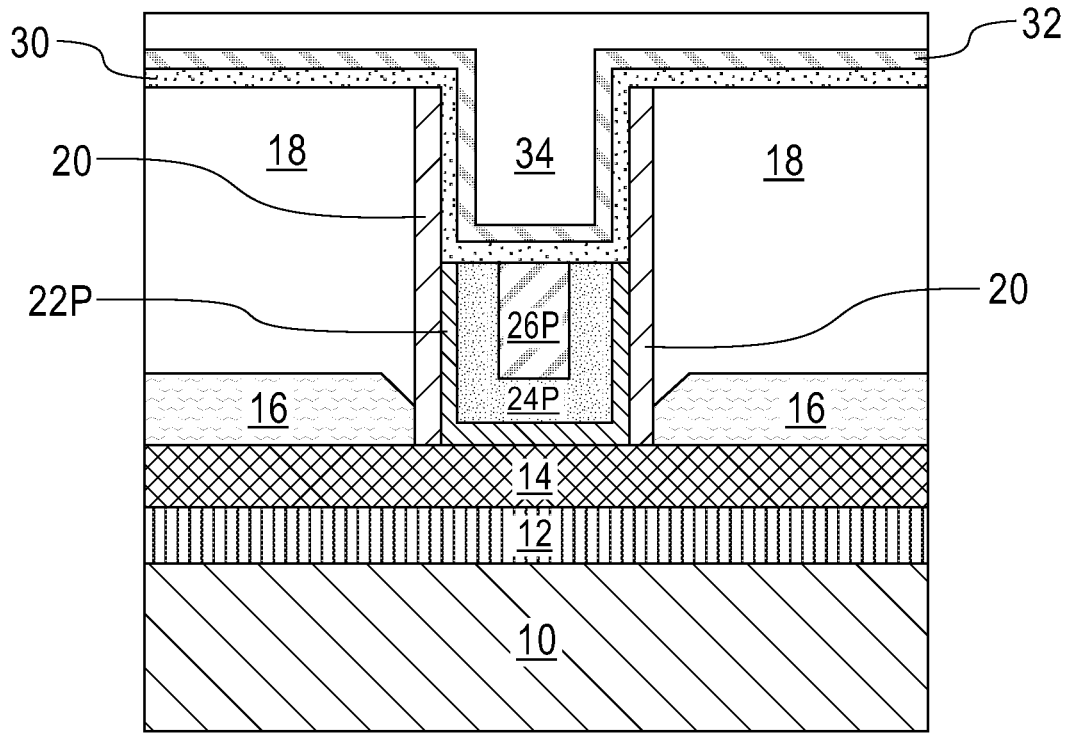
FIG. 4 is a cross sectional view of the exemplary semiconductor structure of FIG. 3 after forming an organic planarizing layer (OPL) on the ferroelectric material layer.

Referring now to FIG. 4, there is illustrated the exemplary semiconductor structure of FIG. 3 after forming an organic planarizing layer (OPL) 34 on the ferroelectric material layer 32. As shown, the OPL 34 completely fills in the remaining volume of the capacitor cavity 28 and is located above the topmost surface of the ILD dielectric material 18.

In one embodiment, the OPL 34 can be an organic material including C, O, and H, and optionally including Si and/or F. In another example, the OPL 34 can be amorphous carbon. In a further example, the OPL 34 can be a spin-on carbon material. The OPL 34 can be formed by spin-on coating, chemical vapor deposition, plasma enhanced chemical vapor deposition, evaporation or chemical solution deposition. The thickness of the OPL 34 can be from 10 nm to 300 nm, although lesser and greater thicknesses can also be employed.

Figure 5:
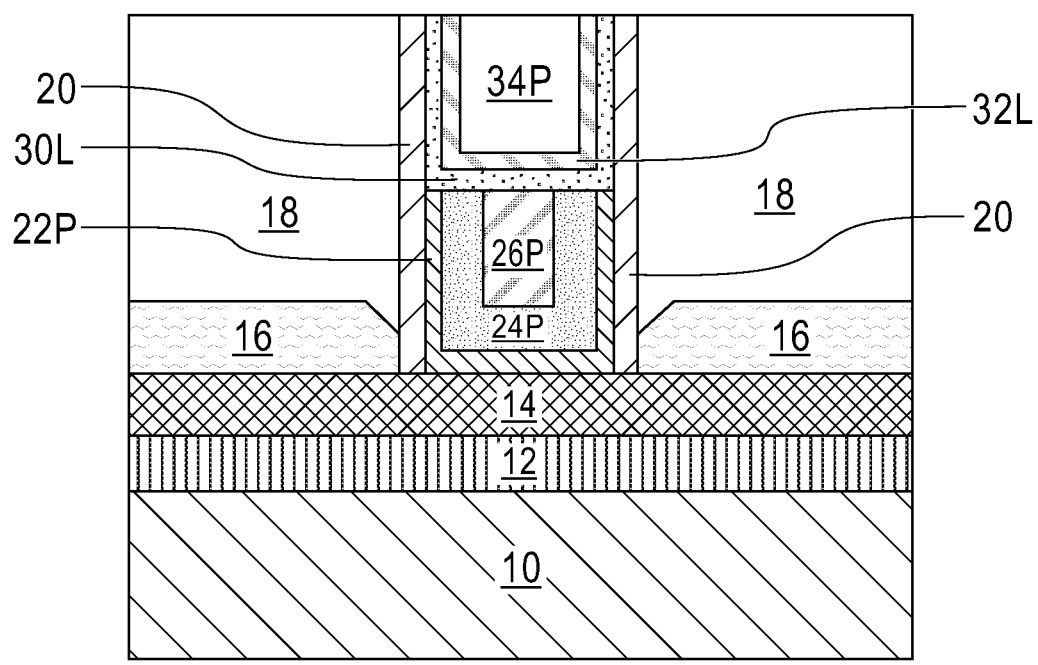
FIG. 5 is a cross sectional view of the exemplary semiconductor structure of FIG. 4 after performing a planarization process to remove the OPL, the ferroelectric material layer, and the bottom electrode material layer from above the topmost surface of the MOL dielectric material, while maintaining portions of the OPL, the ferroelectric material layer, and the bottom electrode material layer in the capacitor cavity.

Referring now to FIG. 5, there is illustrated the exemplary semiconductor structure of FIG. 4 after performing a planarization process. The planarization process removes the OPL 34, the ferroelectric material layer 32, and the bottom electrode material layer 30 from above the topmost surface of the MOL dielectric material 18, while maintaining portions of the OPL 34, the ferroelectric material layer 32, and the bottom electrode material layer 30 in the capacitor cavity 28. The remaining portion of the OPL 34 may be referred to herein as OPL portion 34P, the remaining portion of the ferroelectric material layer 32 may be referred to herein as a ferroelectric material liner 32L, and the remaining portion of the bottom electrode layer 30 may be referred to herein as a bottom electrode material liner 30L. The ferroelectric material liner 32L and the bottom electrode material liner 30L are both U-shaped; thus each liner has a horizontal portion and two vertical extending portions as defined above. Planarization may be performed by chemical mechanical polishing and/or grinding.

Figure 6:
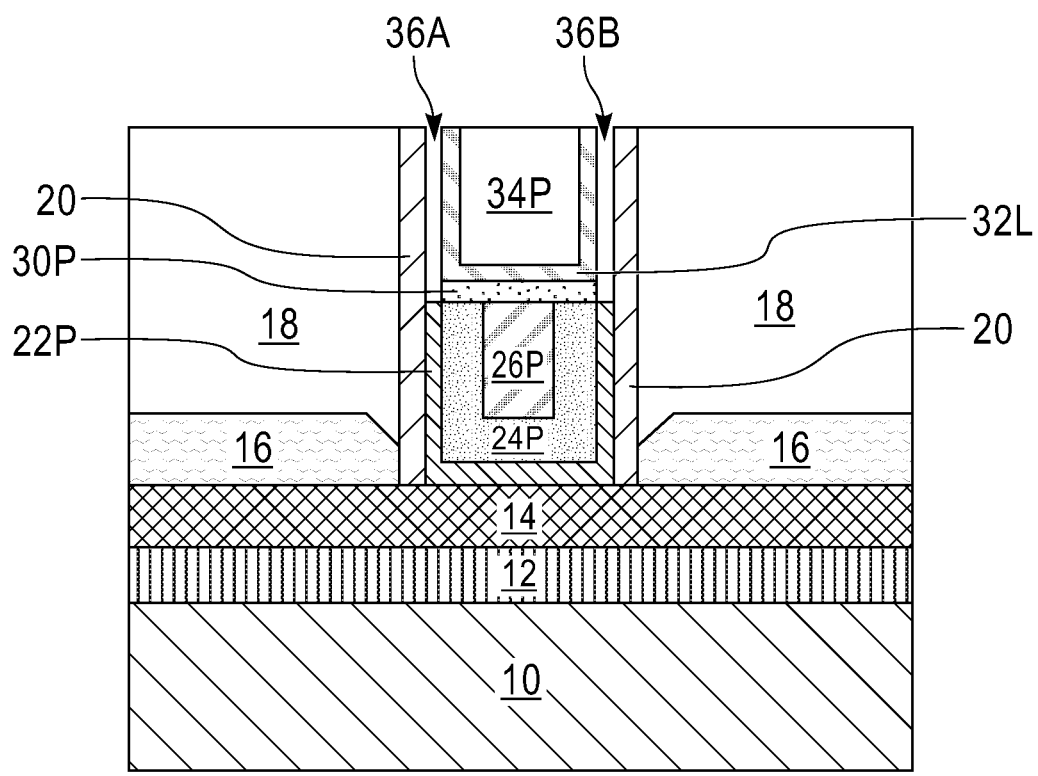
FIG. 6 is a cross sectional view of the exemplary semiconductor structure of FIG. 5 after removing vertical extending portions of the remaining portion of the bottom electrode material layer in the capacitor cavity to provide a first opening located in a first portion of the capacitor cavity and a second opening located in a second portion of the capacitor cavity.

Referring now FIG. 6, there is illustrated the exemplary semiconductor structure of FIG. 5 after removing the vertical extending portions of the remaining portion of the bottom electrode material layer (i.e., the bottom electrode material liner 30L) in the capacitor cavity 28 to provide a first opening 36A located in a first portion of the capacitor cavity 28A and a second opening 36B located in a second portion of the capacitor cavity 28. The vertical extending portions of the bottom electrode material liner 30L can be removed utilizing an anisotropic etching process such as, reactive ion etching, that is selective in removing the material that provides the bottom electrode material liner 30L. As is shown, a portion of the bottom electrode material liner 34L remains beneath the horizontal portion of the ferroelectric material liner 32L. The remaining portion of the bottom electrode material liner 34L (i.e., the horizontal portion) can be referred to herein as a bottom electrode structure 30P. As is shown, the outermost edges of the bottom electrode structure 30P are vertically aligned to the outer sidewall surfaces of the vertical extending portions of the ferroelectric material liner 32L as well as being vertically aligned to the innermost sidewalls of the vertical extending portion of the gate dielectric material portion 22P.

Figure 7:
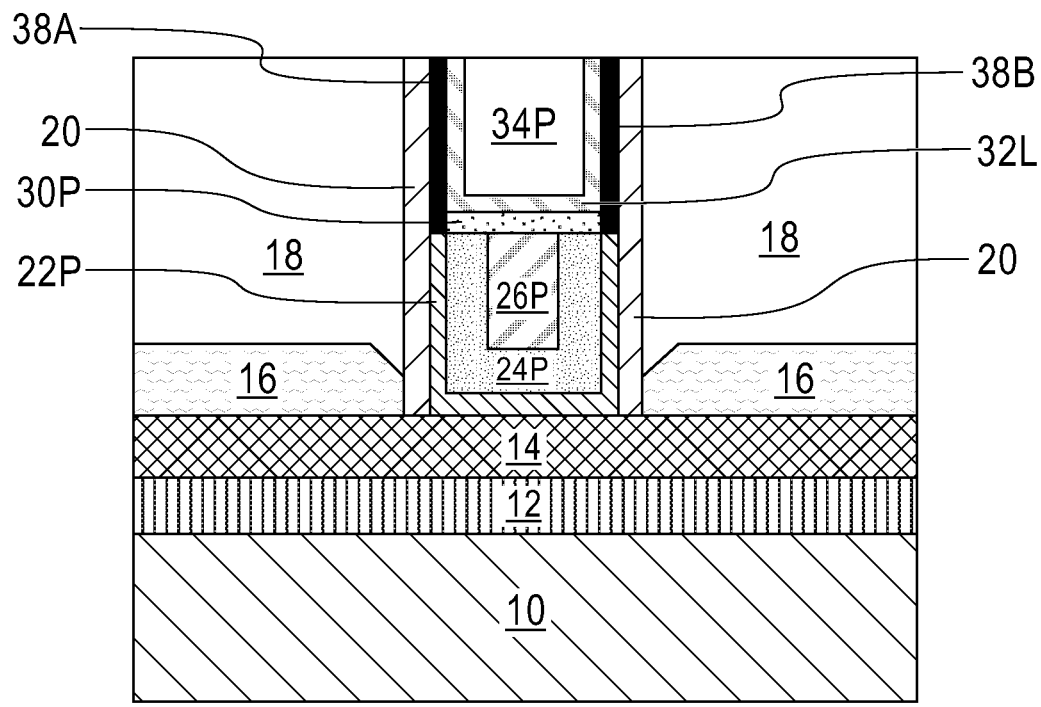
FIG. 7 is a cross sectional view of the exemplary semiconductor structure of FIG. 6 after forming a dielectric spacer in each of the first and second openings.

Referring now to FIG. 7, there is illustrated the exemplary semiconductor structure of FIG. 6 after forming a dielectric spacer 38A, 38B in each of the first and second openings 36A, 36B. Dielectric spacers 38A, 38B include one of the spacer materials mentioned above for gate spacers 20. The dielectric spacers 38A, 38B can be formed by deposition of a spacer material, followed by performing a planarization process such as, for example, chemical mechanical polishing.

Figure 8:
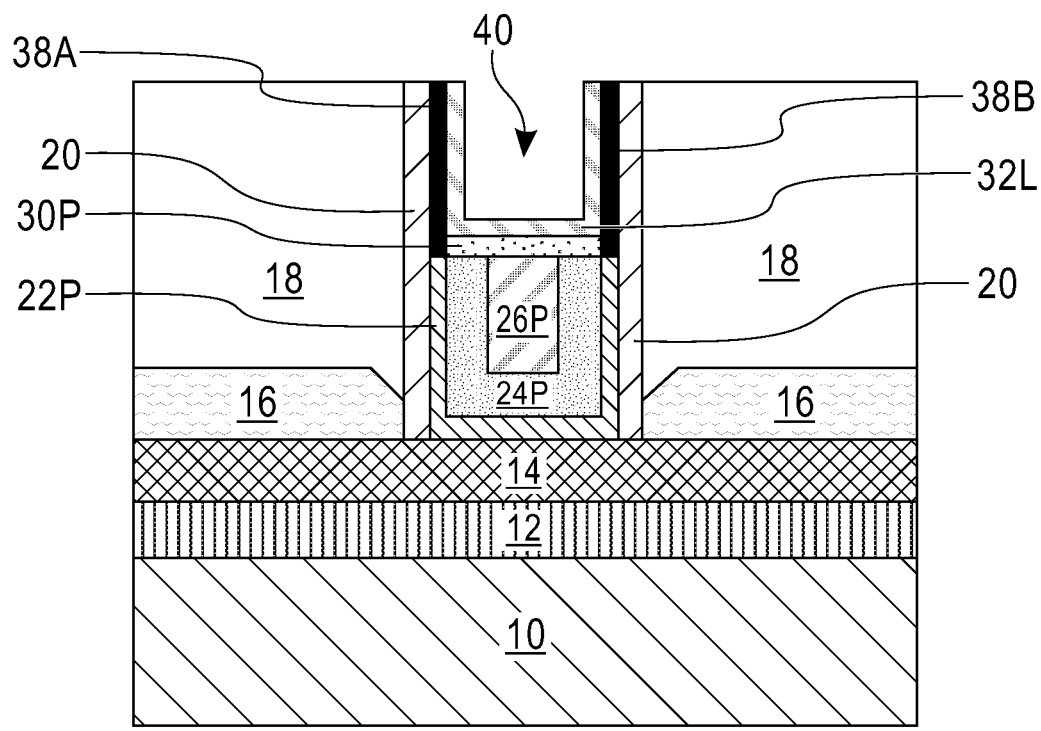
FIG. 8 is a cross sectional view of the exemplary semiconductor structure of FIG. 7 after removing the remaining portion of the OPL from the capacitor cavity.

Referring now to FIG. 8, there is illustrated the exemplary semiconductor structure of FIG. 7 after removing the remaining portion of the OPL (i.e., OPL portion 34P) from the capacitor cavity 28. A top electrode cavity 40 which includes the volume of the previous OPL portion 34P is formed. The OPL portion 34P can be removed utilizing any conventional material removal process including, for example, etching.

Figure 9:
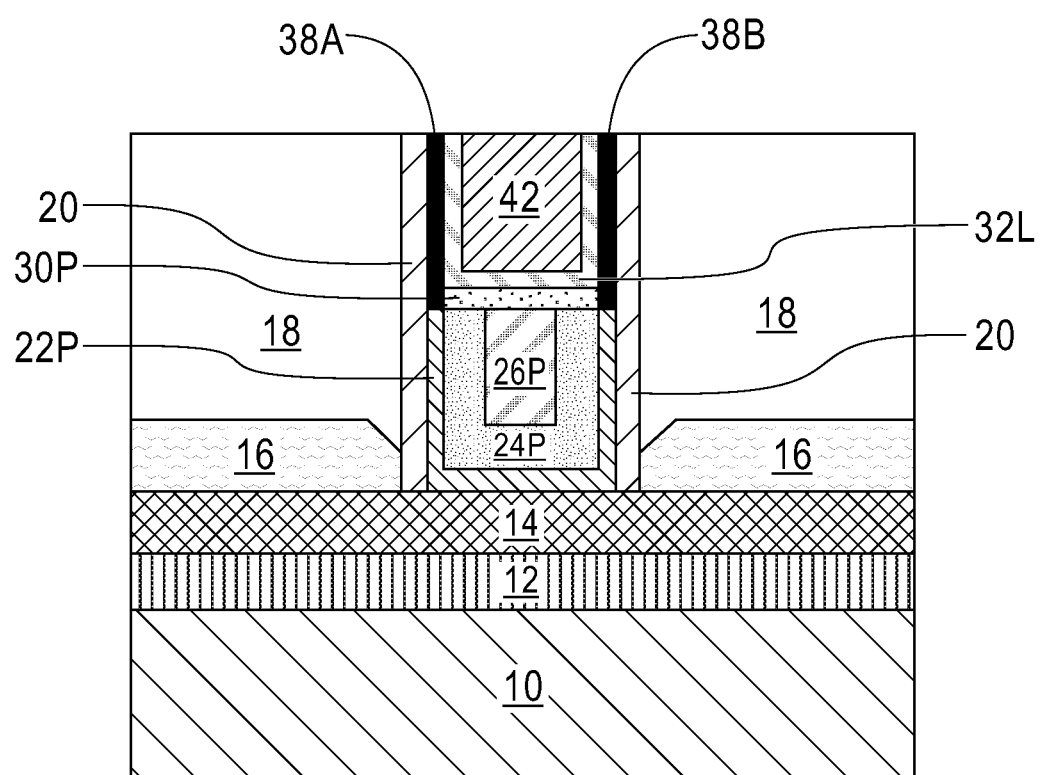
FIG. 9 is a cross sectional view of the exemplary semiconductor structure of FIG. 8 after forming a top electrode structure in the volume previously occupied by the remaining portion of the OPL.

Referring now to FIG. 9, there is illustrated the exemplary semiconductor structure of FIG. 8 after forming a top electrode structure 42 in the volume (i.e., top electrode cavity 40) previously occupied by the remaining portion of the OPL (i.e., OPL portion 34P). The top electrode structure 42 may include one of the conductive materials mentioned above for the bottom electrode structure 30P. In one embodiment, the conductive material that provides the top electrode structure 42 comprises a same conductive material as that which provides the bottom electrode structure 30P. In one example, TiN is used as the conductive material for both the bottom and top electrode structures 30P, 42. In another embodiment, the conductive material that provides the top electrode structure 42 comprises a different conductive material than that which provides the bottom electrode structure 30P. The top electrode structure 42 can be formed by deposition of a conductive material, followed by performing a planarization process.

Collectively, the top electrode structure 42, the ferroelectric material liner 32L and the bottom electrode structure 30P provide a ferroelectric capacitor that is formed in series with the underlying functional gate structure (22P, 24P, 26P). As is shown, the topmost surface of the top electrode structure 42P and the topmost surfaces of the vertical extending portions of the ferroelectric material liner 32L are coplanar with each other as well as being coplanar with a topmost surface of the MOL dielectric material 18. As is further shown, the bottom electrode structure 30P extends partially across the recessed functional gate structure (22P, 24P, 26P), and the bottom electrode structure 30P is located entirely beneath the ferroelectric material liner 30L.

Figure 10:
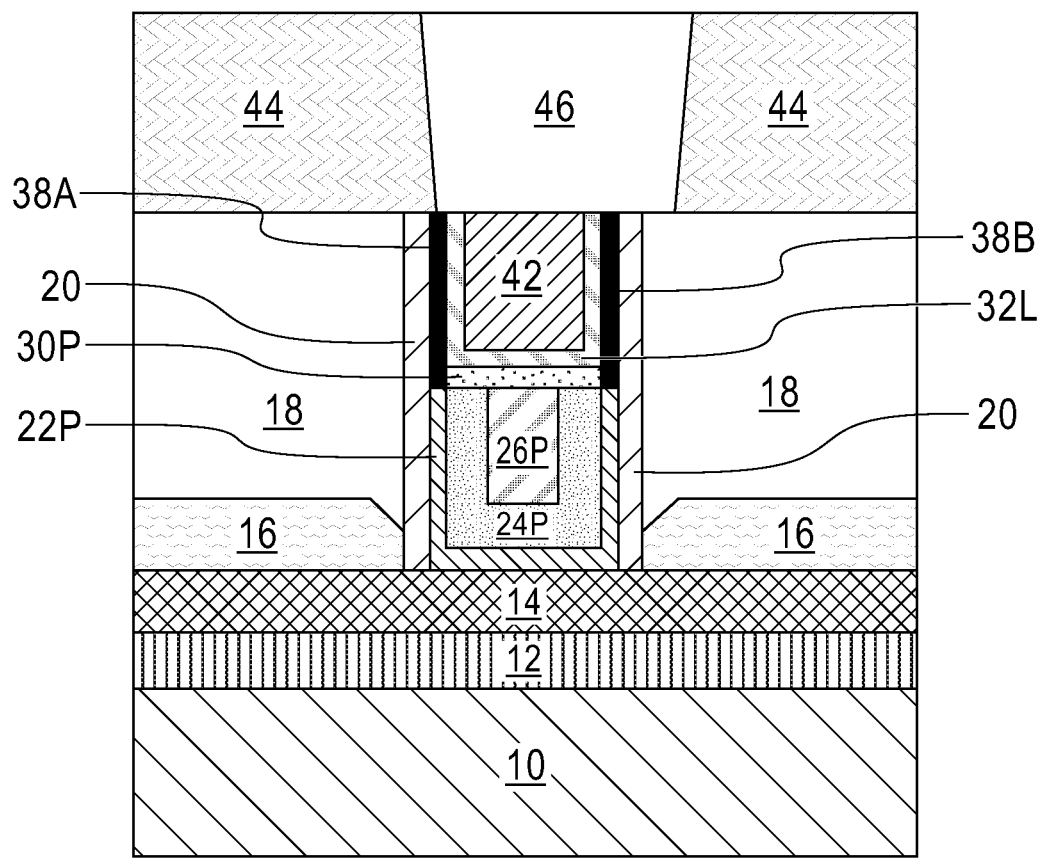
FIG. 10 is a cross sectional view of the exemplary semiconductor structure of FIG. 9 after forming an interlevel dielectric (ILD) containing a contact structure embedded therein.

Referring now to FIG. 10, there is illustrated the exemplary semiconductor structure of FIG. 9 after forming an interlevel dielectric (ILD) 44 containing a contact structure 46 embedded therein. As is shown, a bottommost surface of the contact structure 46 directly contacts at least a portion of the top electrode structure 42.

The ILD 44 may include one of the dielectric materials mentioned above for the MOL dielectric material 18. In one embodiment, the dielectric material that provides the ILD 44 is a same dielectric material as that which provides the MOL dielectric material 18. In another embodiment, the dielectric material that provides the ILD 44 is different than the dielectric material which provides the MOL dielectric material 18. The ILD 44 can be formed utilizing one of the deposition processes mentioned above in forming the MOL dielectric material 18.

Contact structure 46 is then formed by providing a contact opening in the ILD 44. The contact opening can be formed by lithography and etching. After forming the contact opening, a contact metal or metal alloy is formed into the contact opening. A planarization process may be used to provide the final contact structure 46. The contact metal or metal alloy that provides contact structure 46 may include copper (Cu), a copper-aluminum alloy (Cu—Al), a copper-manganese alloy (Cu—Mn), aluminum (Al), or an aluminum-copper alloy (Al—Cu).

Figure 11:
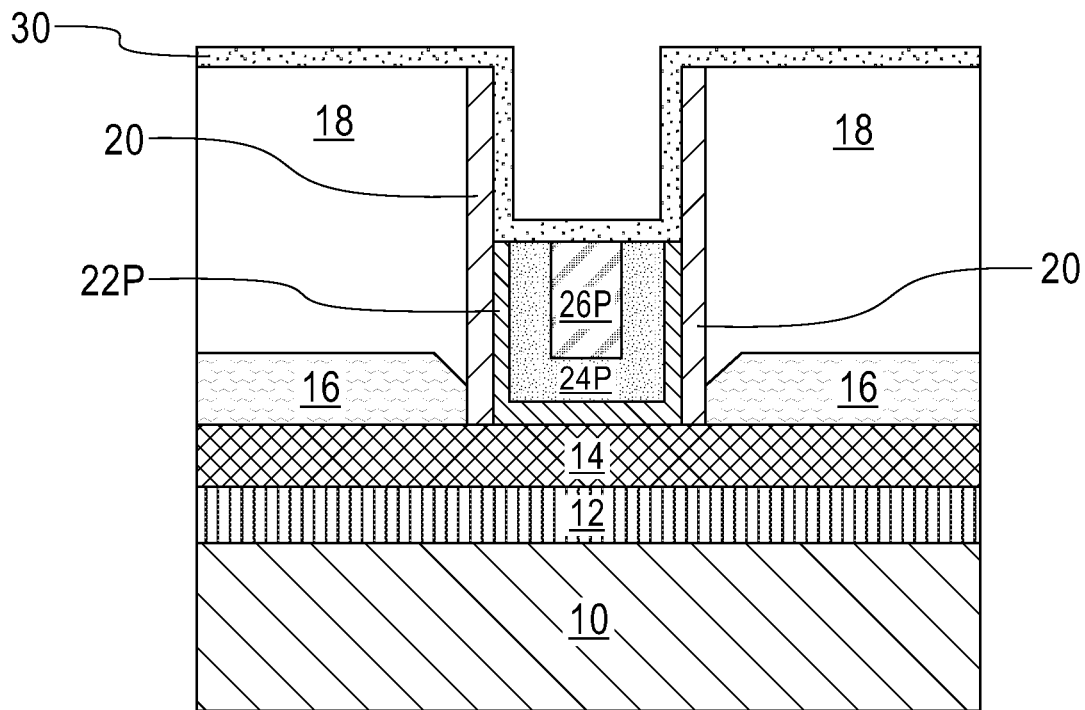
FIG. 11 is a cross sectional view of the exemplary semiconductor structure of FIG. 2 after forming a bottom electrode material layer in accordance with another embodiment of the present application.

Referring now to FIG. 11, there is illustrated the exemplary semiconductor structure of FIG. 2 after forming a bottom electrode material layer 30 in accordance with another embodiment of the present application. Bottom electrode material layer 30 of this embodiment is the same as bottom electrode material layer mentioned above for the embodiment illustrated in FIG. 3. Thus, the materials, deposition methods and thickness mentioned above for bottom electrode material layer 30 apply here as well for this embodiment of the present application.

Figure 12:
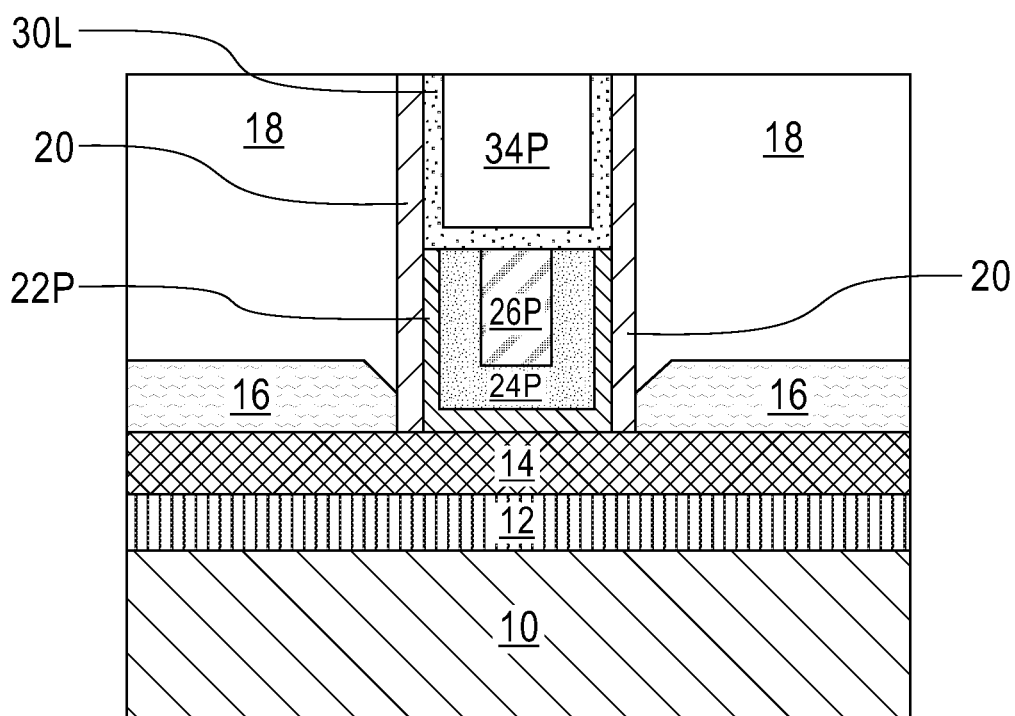
FIG. 12 is a cross sectional view of the exemplary semiconductor structure of FIG. 11 after forming an OPL layer and performing a planarization process to remove the OPL and the bottom electrode material layer from above the topmost surface of the MOL dielectric material, while maintaining a portion of the OPL and a portion of the bottom electrode material layer in the capacitor cavity.

Referring now to FIG. 12, there is illustrated the exemplary semiconductor structure of FIG. 11 after forming a OPL layer and performing a planarization process to remove the OPL and the bottom electrode material layer 30 from above the topmost surface of the MOL dielectric material 18, while maintaining a portion of the OPL (i.e., OPL portion 34P) and a portion of the bottom electrode material layer (i.e., bottom electrode material liner 30L) in the capacitor cavity 28. The OPL layer includes one of the materials mentioned above in the previous embodiment of the present application and it can be formed utilizing one of the deposition processes mentioned above. See, for example, the description of the OPL layer 30 in regard to FIG. 4 of the present application. In this embodiment, the bottom electrode material liner 30L is also U-shaped and the OPL portion 34P is confined between the inner sidewalls of the vertical extending portions of the bottom electrode material liner 30L and above the horizontal portion of the bottom electrode material liner 30L.

Figure 13:
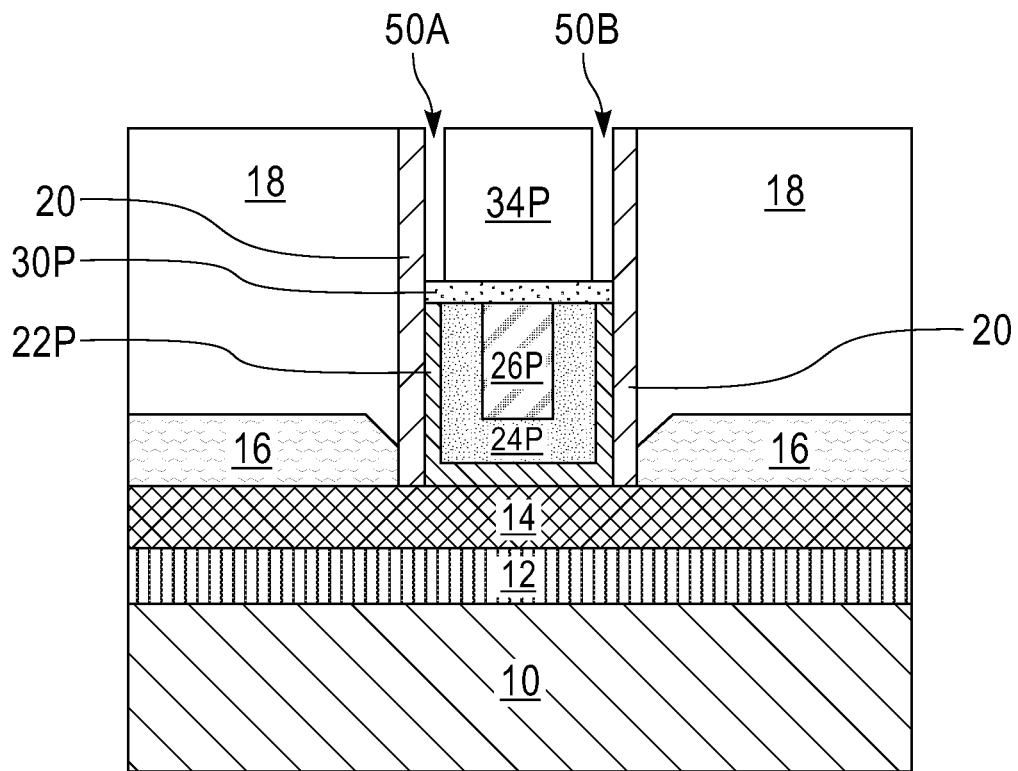
FIG. 13 is a cross sectional view of the exemplary semiconductor structure of FIG. 12 after removing vertical extending portions of the remaining bottom electrode material layer in the capacitor cavity to provide a first opening located in a first portion of the capacitor cavity and a second opening located in a second portion of the capacitor cavity.

Referring now to FIG. 13, there is illustrated the exemplary semiconductor structure of FIG. 12 after removing the vertical extending portions of the remaining bottom electrode material layer (i.e. bottom electrode material liner 30L) in the capacitor cavity 28 to provide a first opening 50A located in a first portion of the capacitor cavity 28 and a second opening 50B located in a second portion of the capacitor cavity 28. In this embodiment, a bottom electrode structure 30P is provided that is present atop the entirety of the recessed functional gate structure (22P, 24P, 26P); as shown the outermost edges of the bottom electrode structure 30P is vertically aligned to the outermost sidewalls of the vertical extending portions of the gate dielectric portion 22P. The bottom electrode structure 30P may include the entirety of the horizontal portion of the bottom electrode material liner 30L as well as bottommost portion of the vertical extending portions of the bottom electrode material liner 30L.

In this embodiment, first and second openings 50A, 50B can be formed utilizing a recess etch that is selective in removing the conductive material that provides the bottom electrode material liner 30L.

Figure 14:
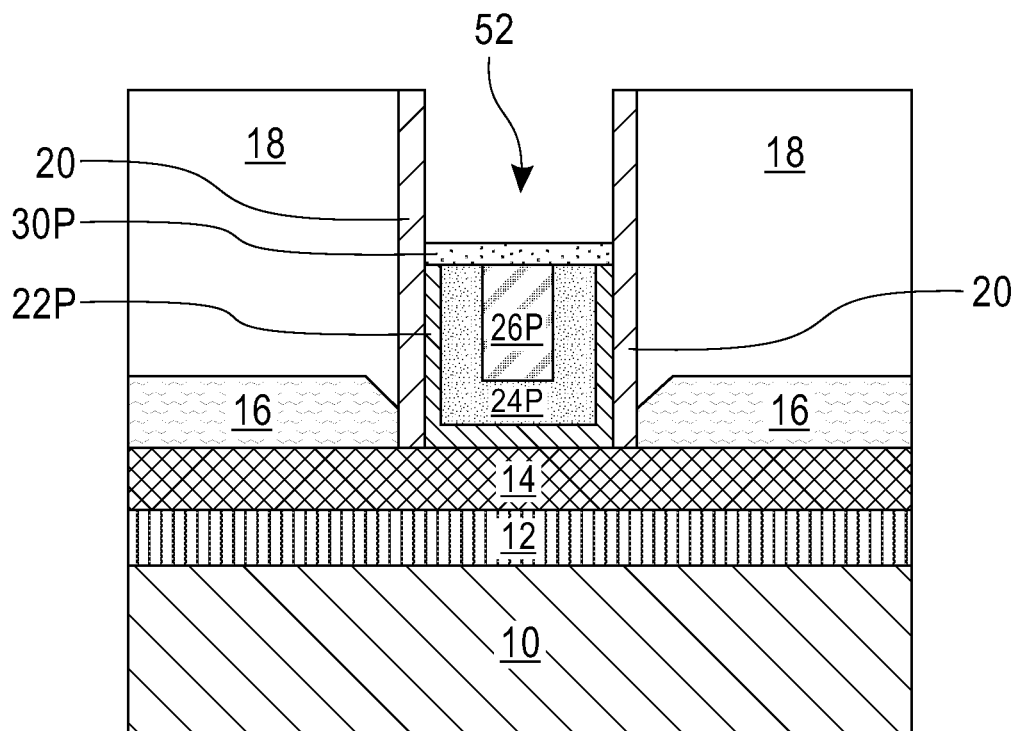
FIG. 14 is a cross sectional view of the exemplary semiconductor structure of FIG. 13 after removing the remaining portion of the OPL from the capacitor cavity to provide a cavity.

Referring now to FIG. 14, there is illustrated the exemplary semiconductor structure of FIG. 13 after removing the remaining portion of the OPL (i.e., OPL portion 34P) from the capacitor cavity 28 providing cavity 52. The OPL portion 34P can be removed utilizing any conventional material removal process including, for example, etching.

Figure 15:
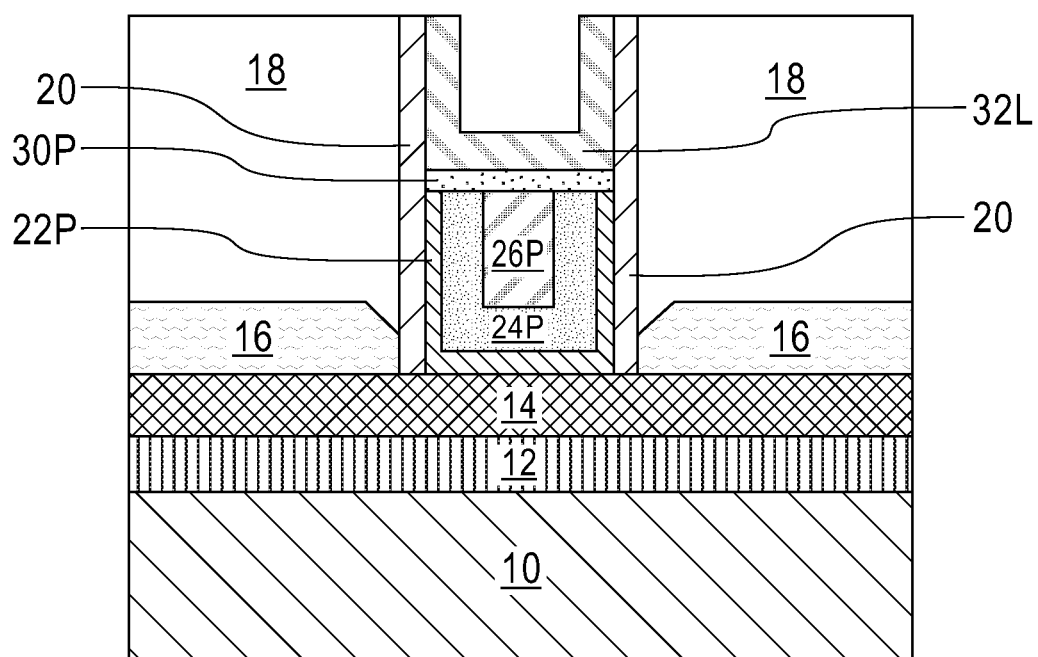
FIG. 15 is a cross sectional view of the exemplary semiconductor structure of FIG. 14 after forming a ferroelectric material liner in the cavity.

Referring now to FIG. 15, there is illustrated the exemplary semiconductor structure of FIG. 14 after forming a ferroelectric material liner 32L in the cavity 50. The ferroelectric material liner 32L is U-shaped and includes one of the materials mentioned above for ferroelectric material layer 30. The ferroelectric material liner 30L is formed by a deposition process as described above in forming ferroelectric material layer 30, followed by a planarization process. The ferroelectric liner 30L does not fill the entire volume of cavity 50.

Figure 16:
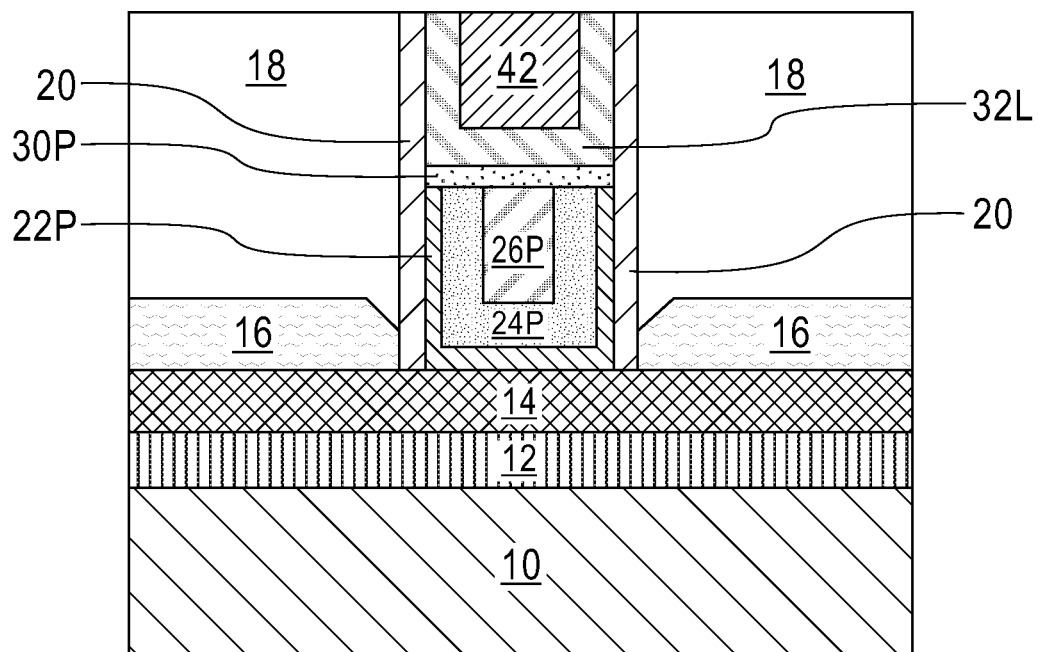
FIG. 16 is a cross sectional view of the exemplary semiconductor structure of FIG. 15 after forming a top electrode structure.

Referring now to FIG. 16, there is illustrated the exemplary semiconductor structure of FIG. 15 after forming a top electrode structure 42. Top electrode structure 42 of this embodiment is the same as top electrode structure 42 of the previous embodiment shown in FIG. 9. Thus, the materials, and method of forming the top electrode structure 42 of the previous embodiment can be used to provide the top electrode structure 42 shown in FIG. 16. Collectively, the top electrode structure 42, the ferroelectric material liner 32L and the bottom electrode structure 30P provide a ferroelectric capacitor that is formed in series with the underlying functional gate structure (22P, 24P, 26P). As is shown, the topmost surface of the top electrode structure 42P and the topmost surfaces of the vertical extending portions of the ferroelectric material liner 32L are coplanar with each other as well as being coplanar with a topmost surface of the MOL dielectric material 18. As is further shown, the bottom electrode structure 30P extends entirely across the recessed functional gate structure (22P, 24P, 26P), and the bottom electrode structure 30P is located entirely beneath the ferroelectric material liner 30L.

Figure 17:
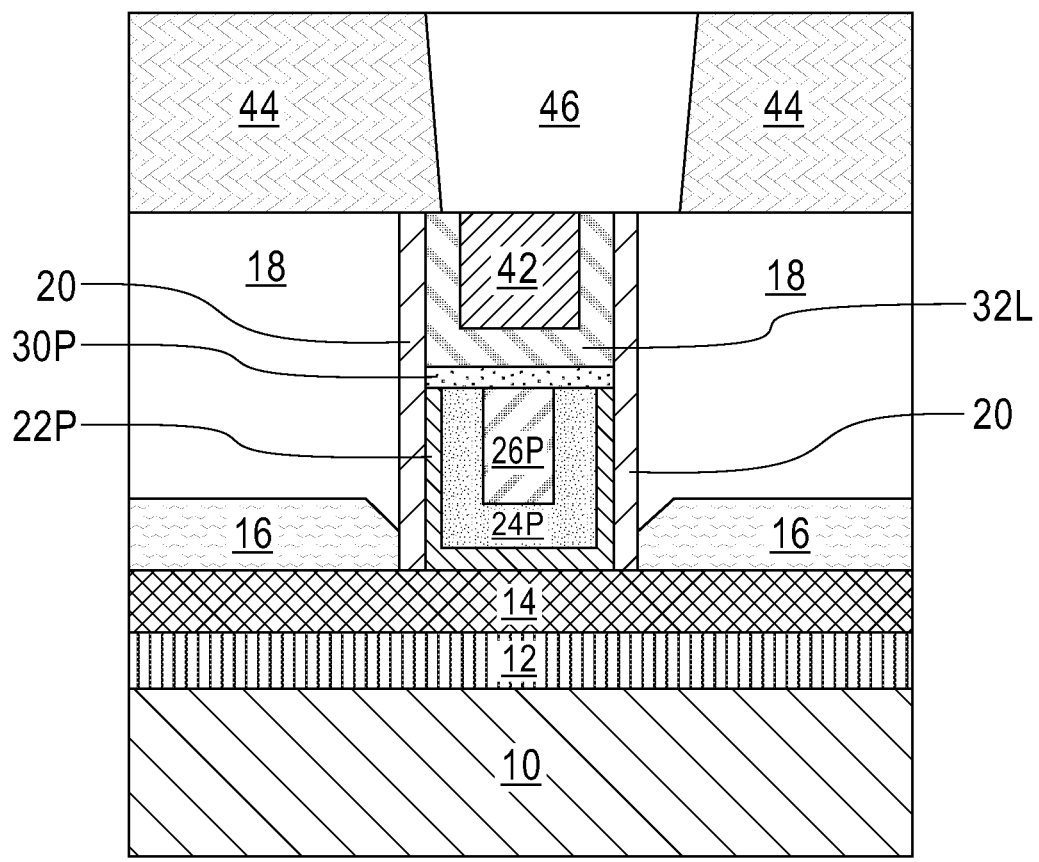
FIG. 17 is a cross sectional view of the exemplary semiconductor structure of FIG. 16 after forming an interlevel dielectric (ILD) containing a contact structure embedded therein.

Referring now to FIG. 17, there is illustrated the exemplary semiconductor structure of FIG. 16 after forming an interlevel dielectric (ILD) 44 containing a contact structure 46 embedded therein. The ILD 44 and contact structure 46 shown in FIG. 17 are the same as that shown in FIG. 10. Thus, the various materials and methods mentioned above in FIG. 10 for providing the ILD and contact structure to that embodiment of the present application are incorporated herein by reference.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a functional gate structure located on a surface of a semiconductor material portion, the functional gate structure comprising a U-shaped gate dielectric portion, a U-shaped workfunction metal portion located on the U-shaped gate dielectric portion, and a gate electrode portion located on the U-shaped workfunction metal portion;
   a ferroelectric capacitor located directly above, and in contact with, a topmost surface of the functional gate structure, the ferroelectric capacitor comprising a bottom electrode structure, a U-shaped ferroelectric material liner located on the bottom electrode structure, and a top electrode structure located on the U-shaped ferroelectric material liner;
   a dielectric spacer that has a lower sidewall portion located directly on each sidewall of the bottom electrode structure and an upper sidewall portion directly on respective sidewalls of vertical extending portions of the U-shaped ferroelectric material liner; and
   a gate spacer that contacts the U-shaped gate dielectric portion and the dielectric spacer,
   wherein a bottommost surface of the U-shaped ferroelectric material liner contacts a topmost surface of the bottom electrode structure, and
   wherein a topmost surface of the U-shaped workfunction metal portion contacts a bottommost surface of the bottom electrode structure.

2. The semiconductor structure of claim 1, further comprising a middle-of-the-line (MOL) dielectric material that laterally surrounds the functional gate structure and the ferroelectric capacitor,
   wherein the MOL dielectric material is entirely separated from sidewalls of the functional gate structure and the ferroelectric capacitor by the gate spacer.

3. The semiconductor structure of claim 2, wherein a topmost surface of the MOL dielectric material is coplanar with topmost surfaces of both the top electrode structure and the vertical extending portions of the U-shaped ferroelectric material liner.

4. The semiconductor structure of claim 1, wherein the bottom electrode structure is located entirely beneath the U-shaped ferroelectric material liner and extends partially across the topmost surface of the functional gate structure.

5. The semiconductor structure of claim 1, wherein the dielectric spacer has a topmost surface that is coplanar with a topmost surface of the top electrode structure and a bottommost surface that is coplanar with the bottommost surface of the bottom electrode structure.

6. The semiconductor structure of claim 1, wherein the topmost surface of the top electrode structure is coplanar with a topmost surface of each vertical extending portion of the U-shaped ferroelectric material liner.

7. The semiconductor structure of claim 1, further comprising a contact structure located above, and in contact with, at least the top electrode structure of the ferroelectric capacitor.

8. The semiconductor structure of claim 1, further comprising an insulator layer located directly beneath the semiconductor material portion.

9. The semiconductor structure of claim 1, further comprising a punch-through stop layer located directly beneath the semiconductor material portion.

10. The semiconductor structure of claim 1, wherein the semiconductor material portion is a semiconductor fin.

11. A semiconductor structure comprising:
    a functional gate structure located on a surface of a semiconductor material portion, the functional gate structure comprising a U-shaped gate dielectric portion, a U-shaped workfunction metal portion located on the U-shaped gate dielectric portion, and a gate electrode portion located on the U-shaped workfunction metal portion;
    a ferroelectric capacitor located directly above, and in contact with, a topmost surface of the functional gate structure, the ferroelectric capacitor comprising a bottom electrode structure, a U-shaped ferroelectric material liner located on the bottom electrode structure, and a top electrode structure located on the U-shaped ferroelectric material liner; and a gate spacer that contacts the U-shaped gate dielectric portion and the U-shaped ferroelectric material liner, wherein a bottommost surface of the U-shaped ferroelectric material liner contacts a topmost surface of the bottom electrode structure, and wherein a topmost surface of the U-shaped gate dielectric portion contacts a bottommost surface of the bottom electrode structure.

12. The semiconductor structure of claim 11, wherein a topmost surface of the top electrode structure is coplanar with a topmost surface of each vertical extending portion of the U-shaped ferroelectric material liner.

13. The semiconductor structure of claim 11, further comprising a middle-of-the-line (MOL) dielectric material laterally surrounds the functional gate structure and the ferroelectric capacitor, wherein the MOL dielectric material is entirely separated from sidewalls of the functional gate structure and the ferroelectric capacitor by the gate spacer.

14. The semiconductor structure of claim 13, wherein a topmost surface of the MOL dielectric material is coplanar with topmost surfaces of both the top electrode structure and vertical extending portions of the U-shaped ferroelectric material liner.

15. The semiconductor structure of claim 11, further comprising a contact structure located above, and in contact with, at least the top electrode structure of the ferroelectric capacitor.

16. The semiconductor structure of claim 11, further comprising an insulator layer located directly beneath the semiconductor material portion.

17. The semiconductor structure of claim 11, further comprising a punch-through stop layer located directly beneath the semiconductor material portion.

18. The semiconductor structure of claim 11, wherein the semiconductor material portion is a semiconductor fin.

19. A semiconductor structure comprising:

a functional gate structure located on a surface of a semiconductor material portion, the functional gate structure comprising a U-shaped gate dielectric portion, a U-shaped workfunction metal portion located on the U-shaped gate dielectric portion, and a gate electrode portion located on the U-shaped workfunction metal portion;

a ferroelectric capacitor located directly above, and in contact with, a topmost surface of the functional gate structure, the ferroelectric capacitor comprising a bottom electrode structure, a U-shaped ferroelectric material liner located on the bottom electrode structure, and a top electrode structure located on the U-shaped ferroelectric material liner; and a gate spacer located on sidewalls of the U-shaped gate dielectric portion and respective sidewalls of vertical extending portions of the U-shaped ferroelectric material liner, wherein a bottommost surface of the U-shaped ferroelectric material liner contacts a topmost surface of the bottom electrode structure, and wherein a topmost surface of the U-shaped workfunction metal portion contacts a bottommost surface of the bottom electrode structure.

20. The semiconductor structure of claim 19, further comprising a dielectric spacer that has a lower sidewall portion located directly on each sidewall of the bottom electrode structure and an upper sidewall portion directly on the sidewalls of the vertical extending portions of the U-shaped ferroelectric material liner.

* * * * *